United States Patent [19]

Sasanuma

[11] 4,415,421

[45] Nov. 15, 1983

[54] PROCESS FOR MANUFACTURING ORNAMENTAL PARTS AND ION PLATING APPARATUS TO BE USED THEREFOR

[75] Inventor: Yasutomo Sasanuma, Kawagoe, Japan

[73] Assignee: Citizen Watch Co., Ltd., Tokyo, Japan

[21] Appl. No.: 470,458

[22] Filed: Feb. 28, 1983

[30] Foreign Application Priority Data

Mar. 5, 1982 [JP] Japan .................................. 57-33944

[51] Int. Cl.$^3$ ............................................ C23C 15/00
[52] U.S. Cl. ........................... 204/192 N; 204/192 R; 204/298; 427/38
[58] Field of Search ............... 204/192 R, 298, 192 N; 427/38

[56] References Cited

U.S. PATENT DOCUMENTS 4,226,082  10/1980  Nishida .............................. 368/285
4,254,159   3/1981  Pulker ............................. 204/192 N

OTHER PUBLICATIONS

Takai Metal Finishing, Apr. 1983, pp. 59–61.

*Primary Examiner*—Arthur P. Demers
*Attorney, Agent, or Firm*—Koda and Androlia

[57] ABSTRACT

Within a vacuum chamber filled with a low-pressure gas atmosphere including nitrogen, titanium is vaporized to coat a titanium nitride film on a surface of an ornamental part such as a watch case by a reactive ion plating method, and a gold film is coated thereon to modulate the color. In this process, the titanium vapor is supplied from an electron beam melting vapor source whereas the gold vapor is supplied from a sputtering vapor source, and the periods both vapors are supplied partly overlap. This process improves the reproducibility of color modulation by coating the gold film and enhances the affinity at the interface between the titanium nitride film and the gold film.

15 Claims, 7 Drawing Figures

PROCESS FOR MANUFACTURING ORNAMENTAL PARTS AND ION PLATING APPARATUS TO BE USED THEREFOR

BACKGROUND OF THE INVENTION

1. Field of the Invention

This invention relates to a process for manufacturing ornamental parts having a color similar to that of gold and offering excellent resistance to corrosion and wear, and also relates to an ion plating apparatus to be used therefor.

2. Background of the Invention

When a wear-resistant film is coated on surfaces of ornamental parts such as watch cases and glass frames, a dry process of ion plating has been used, instead of a wet process of electrochemical plating. The ion plating process permits coating not only metals such as Ni, Pd and Au but also compounds such as carbide and nitride. Especially, a titanium nitride film coated by ion plating exhibits a simulated gold color and excellent corrosion and wear resistance. Therefore, it has been in wide use for a process for manufacturing ornamental parts. The improvements thereon is described in U.S. Pat. No. 4,226,082. However, the titanium nitride film exhibits pale yellow or pale ocher, which is not a necessarily preferable color for ornamental parts.

It is, therefore, proposed to overcoat an extremely thin gold film on the surface of the titanium nitride film so as to produce a vivid color as a whole (see U.S. Pat. No. 4,252,862). In this case, the affinity at the interface between the titanium nitride film and the gold film, and the color reproducibility are of importance for the manufacturing technologies. But, the conventional processes are unsatisfactory in these respects.

SUMMARY OF THE INVENTION

It is an object of the invention to provide a process and apparatus for producing coatings that exhibit a vivid gold-color and offer excellent corrosion and wear resistance, on surfaces of ornamental parts such as watch cases, glass frames, lighters, and pen caps.

It is a specific object of the invention to enhance the durability of coating films by increasing the affinity at the interface between a film mainly composed of titanium nitride and a film mainly composed of gold, when the former is coated on the surfaces of ornamental parts and the latter is coated thereon.

It is a further object of the invention to enhance the color reproducibility of ornamental parts coated with titanium nitride and gold.

For the purposes of the invention, there is provided a process for manufacturing an ornamental part comprising: providing the ornamental part as a work to be treated, an electron beam melting vapor source for evaporating a titanium based metal, and one or more sputtering vapor sources for supplying at least a gold based metal vapor, within a vacuum chamber filled with a low-pressure gas atmosphere including a nitrogen gas; establishing an electric field between said ornamental part and said electron beam melting vapor source to produce a plasma glow discharge therebetween; evaporating and ionizing said titanium based metal in the plasma glow discharge to coat a film mainly composed of titanium nitride on a surface of said ornamental part; at the final stage of this process, applying a negative voltage to one or more targets of said one or more sputtering vapor sources and at the same time, supplying a gold based metal vapor to form a transition layer including both titanium nitride and gold; and while continuing supplying the gold based metal vapor, stopping gradually the evaporation of said titanium based metal to coat a film of the gold based metal as a topcoat layer.

This invention will now be explained with reference to the drawings.

DETAILED DESCRIPTION OF THE INVENTION

The invention will now be explained by the following examples with reference to the drawings:

EXAMPLE I

Figure 1:
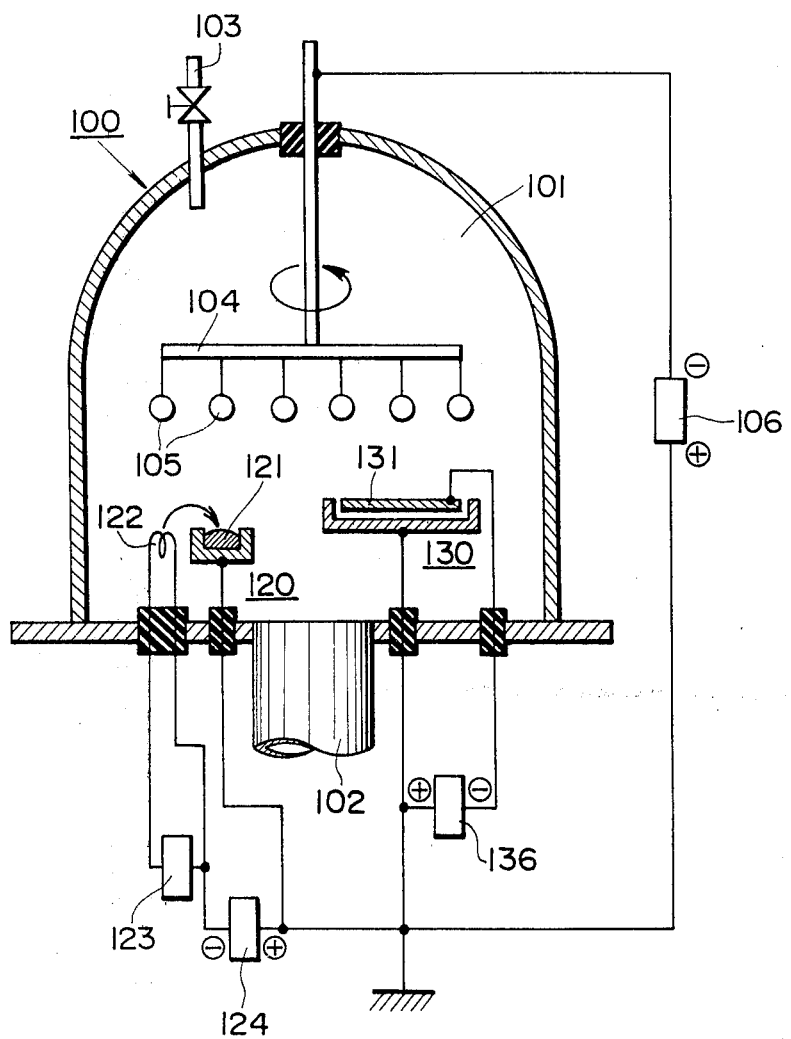
FIG. 1 is a sectional view of an ion plating apparatus of an embodiment of this invention.

Referring to FIG. 1, there is shown an ion plating apparatus 100 of an embodiment of the invention. Within a vacuum chamber 101 having a gas inlet pipe 103 and an evacuation duct 102, there are arranged a rotary work holder 104 rotated around a vertical axis, a filament type electron beam melting vapor source 120, and a sputtering vapor source 130.

Figure 2:
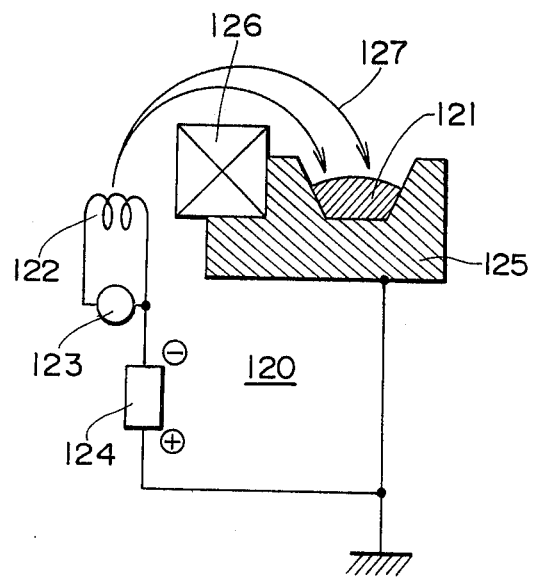
FIG. 2 is a sectional view of a conventional filament type electron beam melting vapor source used in the ion plating apparatus of this invention.

FIG. 2 shows in detail the filament type electron beam melting vapor source 120, in which a filament 122 is heated by a filament power source 123, and a high negative voltage is applied thereto by an electron beam power source 124. An electron beam 127 emitted from the filament 122 is then deflected in a magnetic field established by a magnet 126, and melts and vaporizes a melting material 121 loaded in a hearth 125. In this case, the vapor supplying rate depends on the temperature of molten material.

Figure 3:
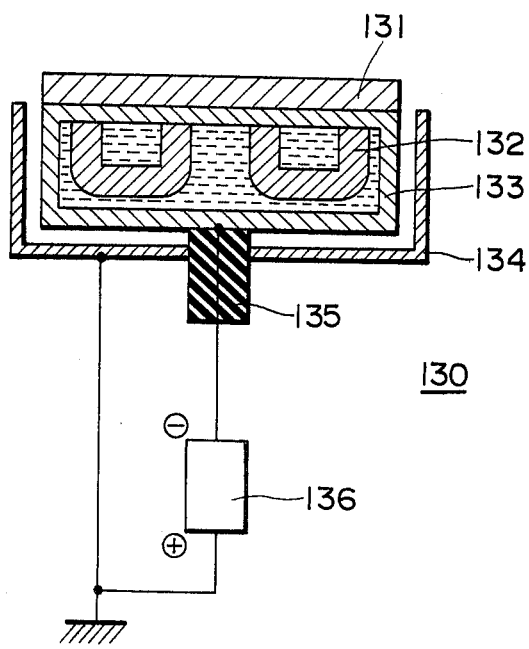
FIG. 3 is a sectional view of a conventional magnetron type sputtering vapor source used in the ion plating apparatus of this invention.

FIG. 3 shows in detail the sputtering vapor source 130, in which a target 131 is mounted on a cooling box 133 having magnets 132 internally. The cooling box 133 is protected by a grounded cover 134. Reference number 135 denotes an insulator. When a negative voltage is applied to the target 131 by means of the sputtering power source 136, positively charged gas ions in the vacuum chamber collide with the target 131, and atoms of the target material are sputtered in vaporized form having high kinetic energy. The sputtering vapor source shown in FIG. 3 is called a magnetron type one and provides high sputtering efficiency of the action of the magnetic field established by the magnets 132. The vapor supplying rate obtained when the sputtering vapor source is used does not depend upon the target temperature but is determined by the applied negative voltage and positive gas ion pressure.

Returning now to FIG. 1, the embodiment will be explained:

Watch cases made of stainless steel (AISI 304) were mounted on the rotary work holder 104. On the electron beam melting vapor source 120 was loaded pure titanium as the melting material 121, and on the sputtering vapor source 130 was set a pure gold plate as the target 131. While the vacuum chamber 101 was evacuated through the evacuation duct 102, a mixed gas of nitrogen and argon (10% $N_2$+90% Ar) was introduced from the gas inlet pipe 103 to a pressure of $8 \times 10^{-4}$ Torr. Next, when a voltage of $-1$ kV was applied by means of a discharge power source 106 through the rotary work holder 104, the vacuum chamber 101 was filled with a violaceous glow discharge plasma. Under these conditions, by driving the filament power source 123, the filament 122 is heated, and further by driving the electron beam power source 124, the melting material 121 of titanium melted and the titanium vapor was supplied from the electron beam melting vapor source 120. Then, the titanium vapor was ionized in the plasma and further reacted with nitride ions. The resultant titanium nitride (TiN) began to deposit on the surfaces of the works 105. Next, when a negative voltage was applied by means of the sputtering power source 136 to the target 131 of gold plate, gold vapor was supplied by sputtering, and then gold films were coated on the TiN layers of the surfaces of the works 105.

Figure 4:
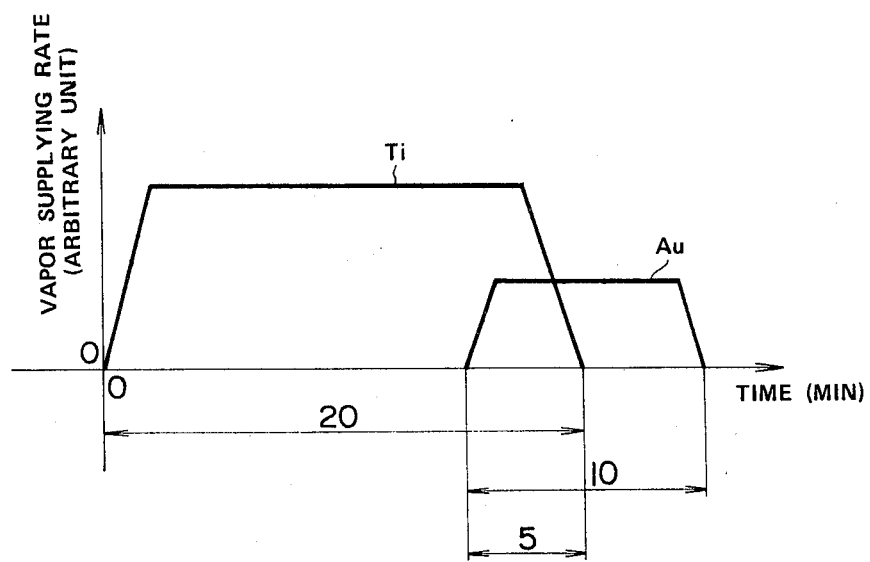
FIG. 4 is a time chart showing a vapor supplying rate of Ti and Au obtained in the manufacturing process of this invention.
Figure 5:
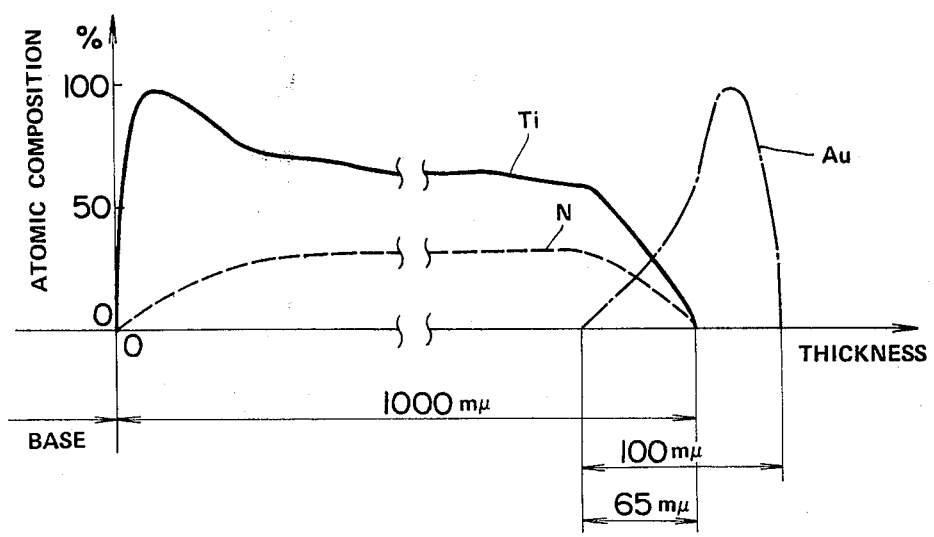
FIG. 5 is a profile showing the atomic composition of a coating film produced in the manufacturing process of this invention.

FIG. 4 shows schematically the supplying rates of titanium and gold vapors in the above embodiment. Of the coating period of 25 minutes in total, for the first 20 minutes, the titanium vapor was supplied and for the second 10 minutes, the gold vapor was supplied. Thus, the first and second supplying periods partly overlap. The atomic composition thus coated was analized by the Auger electron spectroscopy. The result is shown in a profile of FIG. 5.

Of a coating about $1\mu$ thick, the lower layer on the base material was mainly composed of titanium nitride and the upper layer was mainly composed of gold. At the interface therebetween, a transition layer of about 65 m$\mu$ was present, in which the composition continuously varied.

According to the present invention, the presence of this transition layer increases the affinity at the interface and enhances the coating durability.

EXAMPLE II

As in Example I, titanium nitride in thicknesses of 3 to 20$\mu$ was coated on the surfaces of mirror-polished samples of stainless steel, and their surface conditions were observed. The result is shown in Table 1.

TABLE 1

| Sample No. | TiN film thickness ($\mu$) | Surface condition |
|---|---|---|
| 1 | 3 | Luster kept |
| 2 | 5 | " |
| 3 | 8 | " |
| 4 | 10 | " |
| 5 | 12 | Luster lost |
| 6 | 15 | " |
| 7 | 18 | " |
| 8 | 20 | " |

From the result of Table 1, it is noted that when the coating thickness of TiN layer is within 10$\mu$, the base luster is kept.

Next, with the layer including TiN kept 5$\mu$ in thickness, gold layers were coated in thicknesses of 0.1 to 2$\mu$, as in Example I. In this example, the thicknesses of transient layers were variously changed. Colors of these samples and the result of a wear-resistant test are shown in Table 2. As the testing machine for the wear-resistant test, the Model 503 of TELEDYNE TABER, U.S.A. was used, in which the wheel (CS-100) was rotated ten times under a load of 500 g to check if scratches were present.

TABLE 2

Base material |← Layer including TiN →|
Transition layer
|← Layer including Au →|

| Sample No. | Layer including TiN ($\mu$) | Transition layer (m$\mu$) | Layer including Au (m$\mu$) | Color tone* | Wear resistant test* |
|---|---|---|---|---|---|
| 11 | 5 | 0 | 100 | b | z |
| 12 | " | 20 | 100 | b | x |
| 13 | " | 65 | 100 | c | x |
| 14 | " | 0 | 300 | a | z |
| 15 | " | 50 | 300 | a | x |
| 16 | " | 250 | 300 | c | x |
| 17 | " | 50 | 500 | a | x |
| 18 | " | 200 | 500 | a | x |
| 19 | " | 400 | 500 | b | x |
| 20 | " | 0 | 1000 | a | y, z |
| 21 | " | 100 | 1000 | a | y |
| 22 | " | 500 | 1000 | a | x |
| 23 | " | 900 | 1000 | b | x |
| 24 | " | 1000 | 1500 | a | y |
| 25 | " | 1400 | 1500 | b | y |
| 26 | " | 1000 | 2000 | a | y |
| 27 | " | 1500 | 2000 | a | y |

*a ... vivid gold
b ... gold
c ... pale gold
x ... scratch observed
y ... no scratch observed
z ... peeling occurred The result shown in Table 2 leads to the following conclusion:

(1) Where the transient layer is not substantially present (Sample Nos. 11, 14 and 20), peeling occurs, but where the transient layer occupies 10 to 90% of the thickness of the layer including gold, no peeling occurs.

(2) Even if the layer including gold is only 100 m$\mu$ thick, a gold color is produced, but when it is coated in thicknesses of 300 m$\mu$ or more, a vivid gold color is produced.

(3) When the layer including gold exceeds 1000 m$\mu$, i.e. 1$\mu$, it is easy to scratch.

EXAMPLE III

Watch cases made of brass electroplated with nickel and chrome were used as works to be treated (105 in FIG. 1). Utilizing the ion plating apparatus shown in FIG. 1, a layer including TiN and a layer including Au were coated through the same process as in Example I. In this Example III, a titanium alloy (80% Ti, 10% Zr, and 10% Hf) was used as a melting material (121 in FIG. 1), instead of pure titanium, and an Au alloy plate (84% Au, 10% Pd, and 6% Cu) was used as a sputtering target (131 in FIG. 1), instead of a pure gold plate.

The resultant 3μ-thick layer including TiN was composed of a complex nitride layer including TiN, ZrN and HfN, and the 300 mμ-thick layer including gold was composed of an Au-Pd-Cu alloy having the substantially same composition as that of the target (131 in FIG. 1). The thickness of the transient layer was about 100 mμ. The complex nitride layer is superior in the affinity with the base to a simple TiN layer, where the base is composed of brass electroplated with nickel and brass. Also, the layer composed of an Au-Pd-Cu alloy exhibited an elegant color, generally called pink gold or rose gold.

EXAMPLE IV

Figure 6:
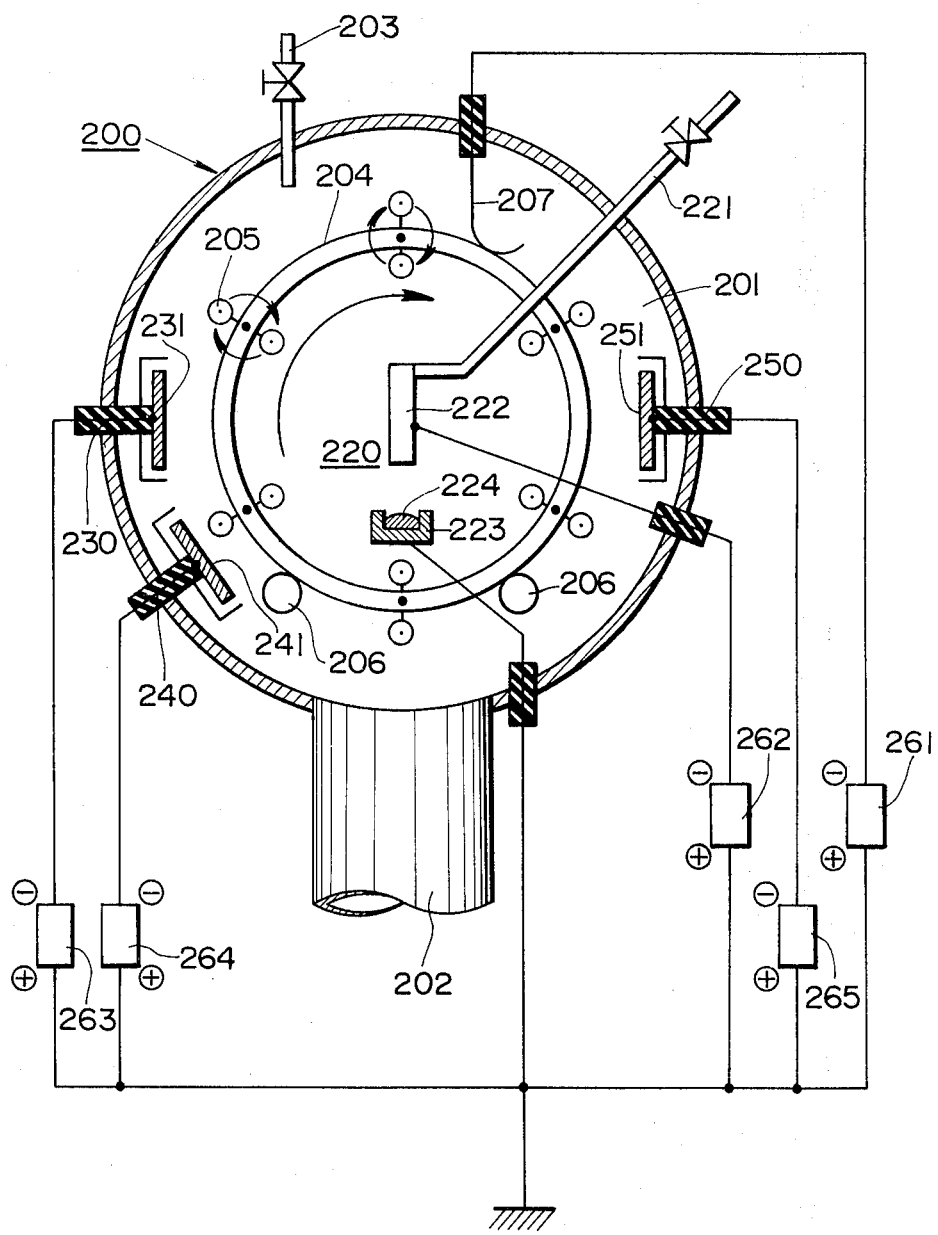
FIG. 6 is a sectional view of an ion plating apparatus of another embodiment of this invention.

Another embodiment of an ion plating apparatus used in this invention is shown in FIG. 6. In this apparatus 200, within the vacuum chamber 201 having a gas inlet pipe 203 and an evacuation duct 202, there are arranged a rotary work holder 204 rotated around a horizontal axis by rollers 206, a hollow cathode type electron beam melting vapor source 220, and a plurality of sputtering vapor sources (230, 240 and 250).

Figure 7:
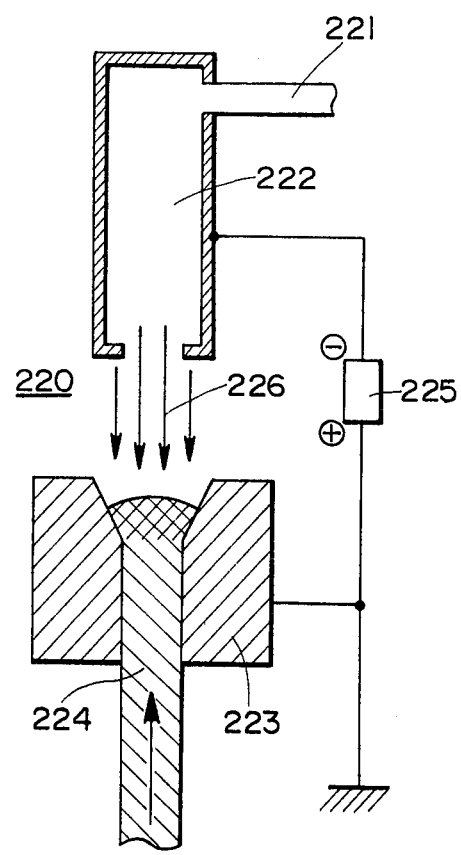
FIG. 7 is a conventional hollow cathode type electron beam melting vapor source used in the ion plating apparatus of this invention.

FIG. 7 shows in detail the hollow cathode type electron beam melting vapor source 220. In this vapor source, a small amount of argon gas was introduced into the hollow cathode 222 made of refractory metal through a gas inlet pipe 221. By means of a cathode power source 225, a high negative voltage overlapping an rf voltage was applied. Within the hollow cathode 222, the argon gas was in the plasma condition. As the top of the cathode 222 was heated, an electron beam 226 was emitted toward a hearth 223. A melting material 224, which was supplied continuously from the bottom of the hearth 223, melted at its top by means of the electron beam, thus producing vapor. This electron beam source has been recently developed and is known to provide very high efficiency.

Returning now to FIG. 6, this embodiment will be explained:

On the rotary work holder 204, watch cases made of stainless steel were mounted as works to be treated 205. In the hollow cathode type electron beam melting vapor source 220, pure titanium was loaded as a melting material 224. In the sputtering vapor sources 230, 240 and 250, a gold plate, a palladium plate, and a copper plate were set, respectively as targets 231, 241 and 251.

As in Example I, while exhausting the vacuum chamber 201 through the evacuation duct 202, from the gas inlet pipe 203, a mixed gas of nitrogen and argon was introduced and from the gas inlet pipe 221, an argon gas was introduced to a pressure of $2 \times 10^{-3}$ Torr. Next, a voltage of $-800$ V was applied to the works 205 by means of a discharge power supply 261 through a sliding brush 207 and the rotary work holder 204. As a result, the vacuum chamber 201 was filled with a violaceous glow discharge plasma. Under these conditions, by driving the cathode power source 262, a negative voltage was applied to the hollow cathode 222. Then, by the electron beam emitted from the cathode 222, the titanium melting material 224 was melted and evaporated. This titanium vapor was ionized in the plasma and reacted with nitrogen ions in the plasma. The resultant titanium nitride was deposited on the surfaces of the works 205.

Next, by driving the sputtering power sources 263, 264 and 265, negative voltages were applied to the targets 231, 241 and 251. Then, the Au, Pd and Cu vapors were sputtered, and Au-Pd-Cu alloy layers were coated together with TiN on the surfaces of the works.

In this final process, by adjusting the negative voltages applied to the plurality of targets 231, 241 and 251, each of the Au, Pd and Cu vapor supplying rates can independently be controlled. Thus, according to this example, the color of the Au-Pd-Cu alloy surface was successfully modulated arbitrarily from light pink gold to deep pink gold with good reproducibility.

One of the features of the manufacturing process of the invention is that the vapor of titanium based metal is supplied from the electron beam melting vapor source, while the vapor of gold based metal is supplied from the sputtering vapor source.

In order to evaporate high melting point titanium, the electron beam melting vapor source has been used from the past. On the other hand, as a vapor source of gold which easily melts, an electron beam melting vapor source, a resistance heat melting vapor source using a tungsten board, or an rf induction melting vapor source has generally been used. It is rare to use a sputtering vapor source having a relatively low vapor supplying rate.

However, the sputtering vapor source has the following features:

First, the sputtering vapor source depends for its supplying rate upon the negative voltage applied to the target and the positive gas ion pressure, and does not depend upon the temperature of molten material as in the melting type vapor source. Therefore, the vapor supplying rate can be changed with a good response.

Secondly, when an alloy of a plurality of elements is evaporated, the vapor composition does not shift by the difference among the vapor pressure of particular element in thermal equilibrium, as in the melting type vapor source. Therefore, it is possible to supply the vapor of the substantially same composition as the alloy which forms the target.

The sputtering vapor source having the above features is essential in order to control the thickness of the transient layer and further to modulate the color of the gold based topcoat film with good reproducibility in the manufacturing process of the invention.

What is claimed is:

1. A process for manufacturing an ornamental part comprising:

providing the ornamental part as a work to be treated, an electron beam melting vapor source for evaporating a titanium based metal, and one or more sputtering vapor sources for supplying at least a gold based metal vapor, within a vacuum chamber filled with a low-pressure gas atmosphere including a nitride gas;

establishing an electric field between said ornamental part and said electron beam melting vapor source to produce a plasma glow discharge therebetween;

evaporating and ionizing said titanium based metal in the plasma glow discharge to coat a film mainly composed of titanium nitride on a surface of said ornamental part;

at the final stage of this process, applying a negative voltage to one or more targets of said one or more sputtering vapor sources and at the same time, supplying a gold based metal vapor to form a transition layer including both titanium nitride and gold; and while continuing supplying the gold based metal vapor, stopping gradually the evaporation of said titanium based metal to coat a film of the gold based metal as a topcoat layer.

2. A manufacturing process of claim 1, wherein said titanium based metal comprises pure titanium.

3. A manufacturing process of claim 1, wherein said titanium based metal comprises a titanium alloy with zirconium and hafnium.

4. A manufacturing process of claim 1, wherein said sputtering target comprises a gold alloy with palladium and copper.

5. A manufacturing process of claim 1, wherein one of said plurality of targets comprises gold.

6. A manufacturing process of claim 1, wherein said low-pressure gas including a nitride gas is composed of nitride and argon.

7. A manufacturing process of claim 1, wherein said film mainly composed of titanium nitride is from 1 to 10 microns in thickness, the film containing gold is from 0.1 to 1 micron in thickness, and the transient layer is corresponding to 10 to 90% of the latter in thickness.

8. A manufacturing process of claim 1, wherein said ornamental part includes a watch case, glass frame, lighter, and pen cap.

9. An ion plating apparatus comprising:
a vacuum chamber having a gas inlet pipe and an evacuation duct;
a rotary work holder arranged in said vacuum chamber for supporting a work to be treated;
an electron beam melting vapor source for supplying a titanium metal vapor;
one or more sputtering vapor sources for supplying at least a gold based metal vapor, said one or more sputtering vapor sources having each a sputtering target.
means for establishing an electric field between said work to be treated and said electron beam melting vapor source; and
means for applying a negative voltage to said sputtering target.

10. An apparatus of claim 9, wherein said electron beam melting vapor source is of a filament type.

11. An apparatus of claim 9, wherein said electron beam melting vapor source is of a hollow cathode type.

12. An apparatus of claim 9, wherein said sputtering vapor source or sources are of a magnetron type.

13. An apparatus of claim 9, wherein one of said plurality of targets comprises gold.

14. An apparatus of claim 9, wherein said rotary work holder has a vertically pivoted rotation axis.

15. An apparatus of claim 9, wherein said rotary work holder has a horizontally pivoted rotation axis.

* * * * *